United States Patent [19]

Matsuoka

[11] Patent Number: 4,973,938
[45] Date of Patent: Nov. 27, 1990

[54] SIGNAL LEVEL ADJUSTER
[75] Inventor: Hiroki Matsuoka, Tokyo, Japan
[73] Assignee: Pioneer Electronic Corporation, Tokyo, Japan
[21] Appl. No.: 408,377
[22] Filed: Sep. 18, 1989
[30] Foreign Application Priority Data
  Jan. 13, 1989 [JP] Japan .................. 1-3123[U]
[51] Int. Cl.$^5$ ............................. H01C 10/14
[52] U.S. Cl. .................................. 338/116
[58] Field of Search ........ 338/116, 315, 316, 128–132, 338/134, DIG. 1, 48

[56]  References Cited
U.S. PATENT DOCUMENTS 2,913,694 11/1959 Heselwood ............ 338/116 X
3,114,126 12/1963 McClay ................... 338/116

Primary Examiner—Bruce A. Reynolds
Assistant Examiner—Marvin Lateef
Attorney, Agent, or Firm—Fleit, Jacobson, Cohn, Price, Holman & Stern

[57] ABSTRACT

A signal level adjuster has a first variable resistor and a second variable resistor. The first variable resistor is inserted in a signal line, and the resistance thereof is variable by a motor. The second resistor is mechanically interlinked to a control knob on a control panel so that the resistance of the second resistor can be varied by the control knob. The motor is energized depending on a change in the resistance of the second variable resistor. The first level adjusting variable resistor may be positioned at any desired location so that and the signal transmission line is shortened.

5 Claims, 1 Drawing Sheet

SIGNAL LEVEL ADJUSTER

BACKGROUND OF THE INVENTION

1. Field of the Invention:

The present invention relates to a signal level adjuster employing a variable resistor.

2. Description of the Related Art:

As shown in FIG. 1 of the accompanying drawings, electric devices such as power amplifiers generally have a level adjusting knob 2 positioned on the front panel thereof and signal input and output terminals 3, 4 disposed on the rear panel thereof. A signal line 5 for transmitting a signal from the signal input terminal 3 to the signal output terminal 4 passes through a variable resistor VR which is coupled to the level adjusting knob 2 on the front panel. With the signal line 5 thus extending in the device, the signal transmission path is long and tends to pick up noise, resulting in poor quality for reproduced sounds.

One solution to the above problem has been to position a level adjusting variable resistor VR in the device near the rear panel thereof, as shown in FIG. 2, to shorten the signal line 5 between the signal input and output terminals 3, 4. The level adjusting knob 2 on the front panel is coupled to the slider or movable contact of the variable resistor VR by a long connecting rod 6. Although the signal line 5 is shortened by the arrangement of FIG. 2, the position of the variable resistor VR is limited by the position of the knob 2, with the result that circuit designs are subject to limitations.

SUMMARY OF THE INVENTION

In view of the foregoing drawbacks of the conventional signal level adjusters, it is an object of the present invention to provide a signal level adjuster which allows a level adjusting variable resistor to be located at any desired position and which shortens a signal transmission path for increased quality for reproduced sounds.

According to the present invention, a signal level adjuster has a first variable resistor and a second variable resistor. The first variable resistor is inserted in a signal line, and the resistance thereof is variable by a motor. The second resistor is mechanically interlinked to a control knob on a control panel so that the resistance of the second resistor can be varied by the control knob. The motor is energized depending on a change in the resistance of the second variable resistor.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 1:
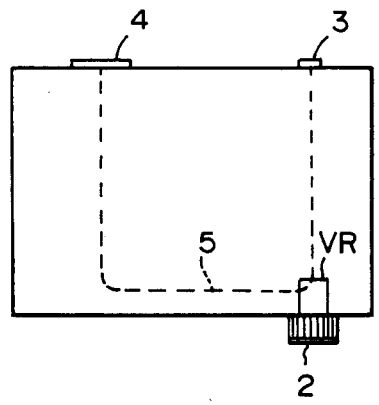
FIGS. 1 and 2 are schematic plan views of conventional signal level adjusters, showing the positions of variable resistors thereof.
Figure 2:
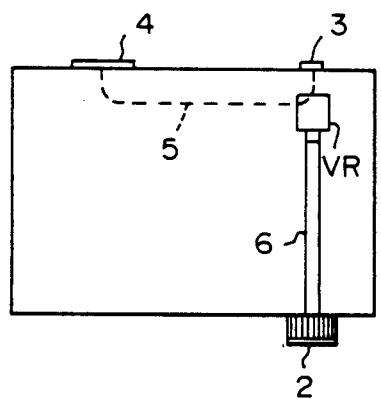
Figure 3:
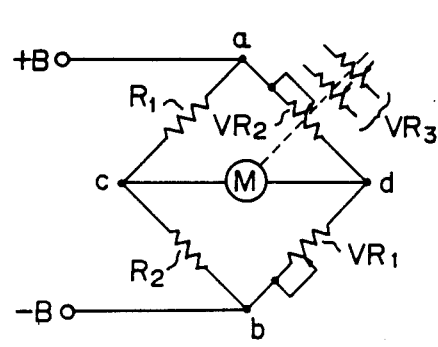
FIG. 3 is a circuit diagram of a signal level adjuster according to the present invention.

FIG. 3 shows a circuit of a signal level adjuster according to the present invention. The signal level adjuster comprises a resistance bridge 1 including fixed resistors $R_1$, $R_2$ on respective two arms, a variable resistor $VR_1$ on another arm, and a variable resistor $VR_2$ on another arm. The resistance bridge 1 has input terminals a, b between which a power supply voltage $+B$, $-B$ is applied. The resistance bridge 1 has output terminals c, d with an electric motor M connected therebetween.

Figure 4:
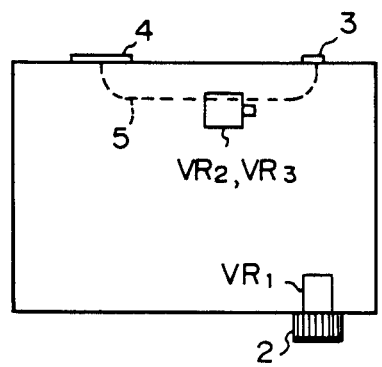
FIG. 4 is a schematic plan view of the signal level adjuster of the invention, showing the positions of variable resistors thereof.

As shown in FIG. 4, the variable resistor $VR_1$ has a movable contact or slider connected to a control knob 2 mounted on a front control panel of an electric device such as an amplifier. Therefore, the variable resistor $VR_1$ is mechanically interlinked to the control knob 2 so that the resistance of the variable resistor $VR_1$ is variable in response to rotation of the control knob 2.

The variable resistor $VR_2$ has a movable contact connected to the rotatable shaft of the motor M so that the resistance of the variable resistor $VR_2$ is variable in response to rotation of the motor M. The variable resistor $VR_2$ is disposed near a signal input terminal 3 and a signal output terminal 4 (e.g., a terminal to be connected to a loudspeaker) which are disposed on the rear panel of the electric device.

A double-ganged variable resistor $VR_3$, for example, for adjusting the level of an audio signal is inserted in a signal line 5 extending between the signal input and output terminals 3, 4. The variable resistor $VR_3$ has a movable contact coupled to the rotatable shaft of the motor M so that the resistance of the variable resistor $VR_3$ is variable in response to rotation of the motor M.

Operation of the signal level adjuster is as follows: It is assumed that the bridge 1 is in equilibrium. When the resistance of the variable resistor $VR_1$ is varied by the control knob 2, the bridge 1 is brought out of equilibrium. There is developed a potential difference between the output terminals c, d of the bridge 1, the potential difference having a polarity and a magnitude depending on the direction and extent in which the resistance of the variable resistor $VR_1$ is varied. The motor M is then rotated in a direction and through a stroke which depends on the polarity and magnitude of the potential difference. In response to the rotation of the motor M, the resistance of the variable resistor $VR_2$ varies, and so does the resistance of the variable resistor $VR_3$. Therefore, the resistance of the variable resistor $VR_3$ can be varied indirectly by varying the resistance of the variable resistor $VR_1$ with the control knob 2. When the resistance of the variable resistor $VR_2$ is varied by the rotation of the motor M, the bridge 1 is brought into equilibrium again, thereby de-energizing the motor M.

In the illustrated embodiment, the motor M is energized through the bridge 1. However, the resistances of the variable resistors $VR_2$, $VR_3$ may be varied by the motor M, and a signal depending on a change in the resistances of the variable resistors $VR_1$, $VR_2$ may be applied as a differential input to a differential amplifier, the differential output of which may be used to energize the motor M.

It is to be understood that the two variable resistors $VR_3$ are, for example, respectively inserted into the R- and L-channel lines in a stereo system so as to attenuate the respective signals in accordance with the manual operation of the control knob 2.

While the variable resistors VR$_2$, VR$_3$ and the motor M are shown as being separate from each other, the arrangement may be simplified by employing a triple-ganged variable resistor comprising variable resistors VR$_2$, VR$_3$ and a common movable contact, and a motor M integrally combined with the triple variable resistor, with the common movable contact being responsive to the motor M. However, the variable resistor should not be limited to the triple-ganged type, but may have larger number of ganged resistor elements depending on the number of signal lines with their signal levels to be adjusted.

With the present invention, as described above, the signal level adjuster has a first variable resistor and a second variable resistor. The first variable resistor is inserted in a signal line, and the resistance thereof is variable by a motor. The second resistor is mechanically interlinked to a control knob on a control panel so that the resistance of the second resistor can be varied by the control knob. The motor is energized depending on a change in the resistance of the second variable resistor. Therefore, the first level adjusting variable resistor may be positioned at any desired location, and the signal transmission line can be shortened for increased quality for reproduced sounds.

Although a certain preferred embodiment has been shown and described, it should be understood that many changes and modifications may be made therein without departing from the scope of the appended claims.

What is claimed is:

1. A signal level adjuster comprising:
   a first variable resistor inserted in a signal line;
   a control panel having a control knob;
   a motor for varying the resistance of said first variable resistor;
   a second variable resistor mechanically interlinked to said control knob so that the resistance of the second variable resistor is variable in response to operation of said control knob; and
   energizing means for energizing said motor in response to a change in the resistance of said second variable resistor.

2. A signal level adjuster according to claim 1, wherein said energizing means comprises a bridge having input terminals between which a power voltage is applicable and output terminals between which said motor is connected, said second variable resistor being connected in one arm of said bridge, further including a third variable resistor connected in another arm of said bridge, the resistance of said third variable resistor being variable by said motor.

3. A signal level adjuster according to claim 2, wherein said first and third variable resistors are in the form of a multiple-ganged variable resistor with the resistances thereof being variable by a common movable contact which is movable in response to energization of said motor.

4. A signal level adjusting system comprising:
   first variable resistor means positioned at a first location in a signal line for varying the level of a signal in said signal line;
   second variable resistor means positioned at a second location remote from said first location;
   a control knob positioned at said second location and operatively connected with said second variable resistor means for controlling the resistance of said second variable resistor means;
   motor means operatively associated with said first variable resistor means for varying the resistance of said first variable resistor means; and
   energizing means operatively associated with said second variable resistor for energizing said motor means in response to a change in the resistance of said second variable resistor and remotely controlling the resistance of said first variable resistor via said motor means for adjusting the level of said signal in said signal line.

5. The signal level adjusting system of claim 4, wherein said energizing means comprises a bridge having input terminals between which a power voltage is applied and output terminals between which said motor means is connected, said second variable resistor means being connected in one arm of said bridge, and further including a third variable resistor means connected in another arm of said bridge, the resistance of said third variable resistor means being variable under control of said motor means.

* * * * *